United States Patent
Hosoi et al.

(10) Patent No.: US 7,519,491 B2
(45) Date of Patent: Apr. 14, 2009

(54) DATA PROCESSING METHOD FOR SPECTRUM ANALYZER

(75) Inventors: Osamu Hosoi, Tokyo (JP); Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/509,440

(22) Filed: Aug. 23, 2006

(65) Prior Publication Data

US 2006/0291631 A1   Dec. 28, 2006

(30) Foreign Application Priority Data

Sep. 2, 2005   (JP)   .............................. 2005-255088

(51) Int. Cl.
*G01R 23/16* (2006.01)
(52) U.S. Cl. ......................................................... 702/77
(58) Field of Classification Search ............... 702/77; 455/226, 226.4
See application file for complete search history.

(56) References Cited

U.S. PATENT DOCUMENTS 6,112,067 A  *  8/2000  Seike et al. .............. 455/226.4

* cited by examiner

*Primary Examiner*—Tung S Lau
*Assistant Examiner*—Xiuquin Sun
(74) *Attorney, Agent, or Firm*—Matthew D. Rabdau

(57) ABSTRACT

A data processing method is provided to enable a calculation based signal analyzer, such as an FFT based spectrum analyzer, to produce results corresponding to a swept spectrum analyzer employing a video bandwidth (VBW) filter. Once a spectrum is produced the frequency axis is replace by a corresponding time axis, so that a time domain filter, such as a video bandwidth (VBW) filter can be applied. The filter characteristics are applied by performing an FFT to produce frequency domain data, multiplying by the frequency response to produce a filtered version, performing an inverse FFT and replacing the time axis with the original frequency axis to produce a filtered version of the display spectrum data.

6 Claims, 2 Drawing Sheets

DATA PROCESSING METHOD FOR SPECTRUM ANALYZER

BACKGROUND OF THE INVENTION

The present invention relates to data processing for a signal analyzer using FFT calculation, especially to data processing for a signal analyzer for simulating results that a swept spectrum analyzer using a video filter would provide.

FIG. 1 is a block diagram of an example of a swept spectrum analyzer. A control means (not shown) including microprocessor, memory, and hard disk drive, etc. controls block operations according to settings by a user through an operation panel as is well known in the art. An input variable attenuator 10 adjusts the level of an input signal under test and a mixer 12 mixes it with a local signal from a sweep frequency oscillator 14. The frequency of the local signal changes according to a sweep signal (ramp waveform) from a sweep signal generator 16. This processing leads to a linear relationship between frequency and time changes on a resultant spectrum signal. The time for one frequency sweep is the sweep time. An intermediate frequency (IF) amplifier 18 amplifies the output of the mixer 12 and an IF filter 20 passes it through a bandwidth, or RBW (Resolution Bandwidth) set by a user. A logarithmic amplifier 22 amplifies and a detector 24 detects it to produce a spectrum signal.

A video filter 26 is a low pass filter and reduces noise due to circuits following the IF filter 20 by setting the bandwidth (VBW: Video Bandwidth) properly. The video filter 26 also reduces noise of an incoming signal display as displayed on screen in similar fashion to averaging. It does not reduce the average noise (as would the case with a resolution bandwidth (RBW) reduction), but it does reduce the peak to peak amplitude excursion, also referred to as the "top-to-bottom thickness" of noise or noise-like signals. Note that the video filter 26 is applied to the spectrum signal, which is a time function. An analog to digital converter (ADC) 27 converts the output of the video filter 26 into digital data. The digital data is stored in a memory 28 and displayed as a display spectrum waveform on the screen of a display 29 of which horizontal axis is frequency while it cooperates with the sweep signal from the sweep signal generator 16. It uses a linear relationship between the frequency change of the spectrum signal and the time change over the sweep. The waveform is displayed after the memory 28 stores the data, which prevents intensity of the spectrum waveform from becoming too faint to easily observe. A frequency span (frequency range) on the frequency axis of the screen is changed according to the user setting.

The narrower RBW and VBW become, the slower responses of the filters 20 and 26 become, which requires making the sweep time slower. The control means automatically selects a proper sweep time while considering the selected frequency span. However, the user could set an arbitrary sweep time. Such a swept spectrum analyzer is disclosed by U.S. Pat. No. 6,191,571, for example.

FIG. 2 is a block diagram of a signal analyzer using FFT calculation, such as a FFT-based spectrum analyzer. Similar to FIG. 1, a control means including microprocessor, memories, hard disk drive, etc. controls each block according to settings by a user through an operation panel. An input signal under test is provided to a mixer 32 through an input attenuation circuit 30 and mixed with a local signal from a local oscillator 34. The frequency of the local signal is changed according to the user setting, but the frequency is not swept, which is different from the swept-type spectrum analyzer shown in FIG. 1. The output of the mixer 32 is converted into an intermediate frequency (IF) signal through IF amplifier 38 and IF filter 40 and an analog to digital converter (ADC) 42 converts it into digital data. The IF filter 40 mainly works to remove an image frequency but not to define the RBW, which is different from the case of FIG. 1.

A digital down converter 44 may further digitally down convert the digital data from the ADC 42, which may be realized by a digital signal processor (DSP). An FFT (fast Fourier transform) arithmetic block 48 receives the data from the converter 44 and produces the number N (N is a natural number and may be 1024 for example) of spectrum data per frame which are derived from the time domain data acquired every predetermined period (i.e. frame). An RBW arithmetic block 50 applies filter characteristics of an RBW virtually equivalent to the IF filter 20 to the spectrum data of frequency domain data by digital calculation according to a RBW setting by the user to reduce the noise components. The microprocessor can perform the FFT and RBW calculations, for example. Alternatively, the FFT and RBW calculations may be performed in a dedicated circuit, such as a DSP, and ASIC or an FPGA. A display 52 displays the produced spectrum data as a spectrum waveform on the screen that has a horizontal axis of frequency according to a frequency span set by the user. The spectrum waveform of the set frequency span is displayed by the spectrum data of one frame.

The signal analyzer shown in FIG. 2 has no element to increase noise after getting the spectrum because it digitizes the input signal to obtain the spectrum by FFT calculation.

Some legacy frequency analysis procedures call for the use of a swept spectrum analyzer and the measurement condition defines the video bandwidth (VBW) to be used. Under the defined measurement condition, the FFT-based spectrum analyzer, or signal analyzer, cannot replace the swept spectrum analyzer because it can not set the VBW since it has no video filter and the FFT-based analyzer cannot ensure compatibility with the swept spectrum analyzer.

The details and improvements over the prior solutions will be discussed in greater detail below.

SUMMARY OF THE INVENTION

Accordingly, a signal analyzer, or spectrum analyzer, using FFT calculations that is able to set an equivalent VBW to obtain a result equivalent to using the analog video filter is provided. As described, the signal analyzer does not produce noise after the spectrum is produced but the result is different depending on whether the video filter is applied to a signal under test. Therefore if the video filter characteristics are applicable to the FFT signal analyzer, such as an FFT-type spectrum analyzer, it can keep compatibility with a result measured by a swept spectrum analyzer.

A signal analyzer has a digitizing means for converting an input signal into an intermediate frequency signal and digitizing it to produce digital data, a digital arithmetic means for calculating and producing spectrum data from the digital data, and a display means for displaying the spectrum data wherein it essentially does not require a video filter. The present invention, however, provides data processing method for a signal analyzer emulating a swept spectrum analyzer with a video filter.

The video filter is applied to a spectrum signal that is a time function but the spectrum data that the FFT signal analyzer produces has no immediately apparent relationship between frequency and time changes, so it is necessary to define the correspondence between the frequency and time changes. Therefore the present invention replaces the frequency change of the spectrum data with the corresponding time change, and then desired filter characteristics are applied to it. In particular, a predetermined time is assigned to a frequency span to replace the frequency change of the spectrum data with the time change. The predetermined time corresponds to a sweep time as would be used in a swept spectrum analyzer and can be selected properly according to frequency span, resolution bandwidth (RBW) and video bandwidth (VBW) set by a user. A frequency span is assumed to correspond to a virtually defined sweep time and then frequency and time changes are defined to have a linear relationship so that the number N of spectrum data are deemed to be in time series. Then the spectrum data can be processed as if it were time domain data to which video filter characteristics are applied to get a result equivalent to applying the video filter.

One method for applying the desired filter characteristics may be that the digital arithmetic means converts the spectrum data of which frequency change is replaced with the time change into frequency domain data, applies the desired filter characteristics to the frequency domain data and then convert it back to time domain data. Another method may be that the digital arithmetic means conducts a convolution integral between the spectrum data of which frequency change is replaced with the time change and an impulse response of the filter.

Embodiments of the present invention enables a signal analyzer to set a video bandwidth (VBW) of a video filter equivalently and then allows the signal analyzer to replace a swept spectrum analyzer.

DETAILED DESCRIPTION OF THE INVENTION

Figure 3:
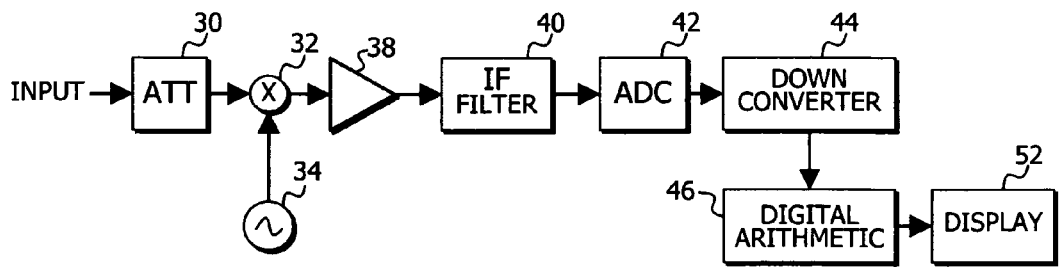
FIG. 3 is a functional block diagram of an example of a signal analyzer according to the present invention.

FIG. 3 is a functional block diagram of a signal analyzer according to the present invention wherein blocks corresponding to those of the conventional example are indicated by the same numbers. A control means including microprocessor, memory, hard disk drive, etc. controls operation of each block according to settings through an operation panel by a user. Program for controlling the circuit operation may be previously stored in a memory means such as the hard disk drive, etc.

Figure 1:
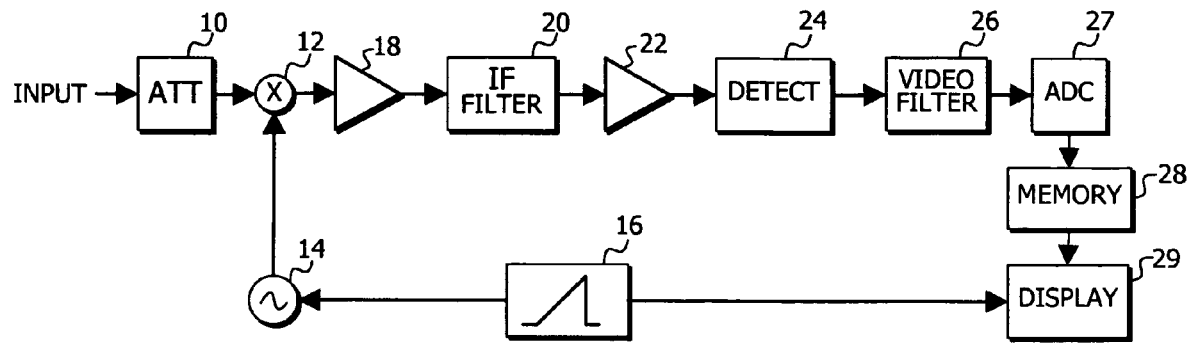
FIG. 1 is a block diagram of an example of a swept spectrum analyzer.
Figure 2:
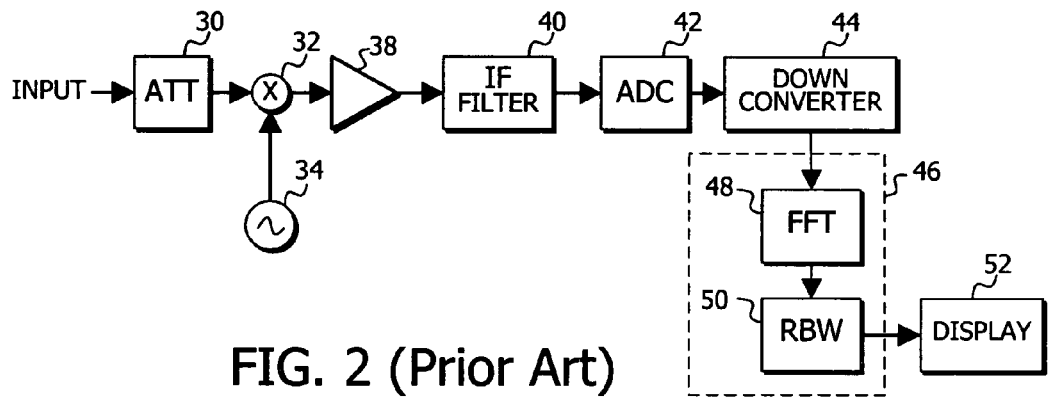
FIG. 2 is a functional block diagram of an example of a conventional signal analyzer.
Figures 4, 5:
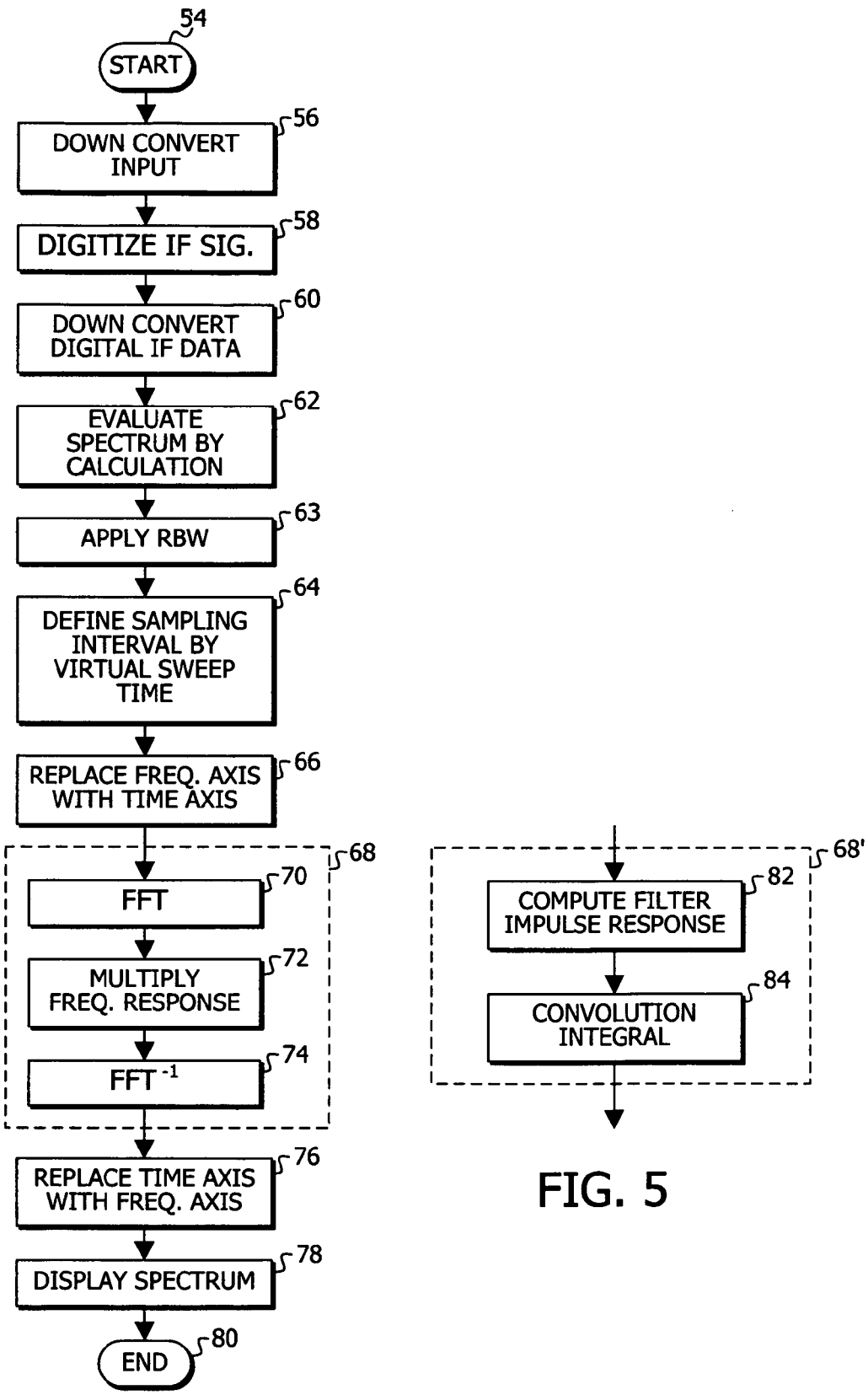
FIG. 4 is a flow chart of data processing by the signal analyzer according to the present invention.
FIG. 5 is a flow chart of another example of a method for applying the filter characteristics.

The signal analyzer according to the present invention is different in the data processing by a digital arithmetic block 46 relative to the conventional one shown in FIG. 2. Referring to FIGS. 3 and 4, which show a signal analyzer similar to the a the FFT-type signal analyzer shown in FIG. 2, an input variable attenuation circuit 30 adjusts the level of an input signal under test and it is provided to a mixer 32 and mixed with a local signal from a local oscillator 34. The output of the mixer 32 passes IF amplifier 38 and IF filter 40 and is down converted into an intermediate frequency signal (step 56) and then an analog to digital converter (ADC) 42 converts it into digital data (step 58). A digital down converter 44, which may be a digital signal processor (DSP), further digitally down converts the digital IF data from the ADC 42 (step 60). A digital arithmetic block 46 performs digital calculation as described below as well as FFT and RBW calculations similar to the conventional one. As described above, time domain IF data obtained every predetermined time (frame) is converted into the number N (N is a natural number, 1024 for example) of frequency domain data (spectrum data) in the FFT calculation (step 62). The filter characteristics defined by the RBW (resolution bandwidth) set by a user is applied to the spectrum data of the frequency domain data respectively (step 63). The FFT and RBW calculations may be done by arithmetic process of the microprocessor, for example.

As described above, the video filter is applied to a spectrum signal as a time function. However, the spectrum data produced by the signal analyzer is the frequency domain data and has no direct relationship between the frequency and time changes so that the video filter characteristics cannot be applied to it directly. Therefore a process is necessary to treat the spectrum data of the frequency domain data as if it were time domain data.

A spectrum signal of a swept spectrum analyzer is produced when that spectrum analyzer sweeps across a frequency span during a predetermined sweep time. In case of the FFT-type signal analyzer, the number N of spectrum data in one frame displays a spectrum waveform across a frequency span. A sweep time can be virtually assigned to a frequency span of the signal analyzer's display spectrum waveform. That is, if the number N of spectrum data in one frame were considered to be time-series data produced during the sweep time, it could make the spectrum data correspond to a spectrum signal of a swept spectrum analyzer.

Specifically, let a virtual sweep time be Tsw that corresponds to a sweep time of a swept spectrum analyzer and then define the number N of spectrum data in one frame produced as one for every virtual sampling interval Ts=Tsw/N. That is, a linear relationship between the frequency change of the spectrum data and the apparent time change is defined. This relationship allows the number N of the spectrum data produced by the signal generator to be dealt with as if it were time domain data. An alternative view is that this process assigns a time relationship to the spectrum data and replaces the frequency axis with a time axis (step 66). This allows filtering of the FFT display data as if it were a time waveform.

The virtual sweep time may be arbitrarily selected by the control means according to the frequency span, RBW and VBW set by the user when emulating a swept spectrum analyzer or, alternatively, the user can directly set an arbitrary sweep time with a swept spectrum analyzer in mind. The set VBW (video bandwidth) also does not exist and is a virtual VBW calculated to emulate the VBW function of a swept spectrum analyzer.

A step 68 is a process of applying desired filter characteristics to the spectrum data as if it were time domain data by digital calculation and has additional sub-steps. In step 70, display spectrum data produced by a first FFT, which has had its frequency axis replaced by a corresponding time axis to provide time domain data, are converted into frequency domain data by another FFT calculation. This second frequency domain data and a frequency response of the filter characteristics are multiplied to apply the filter characteristics to the display data (step 72). After that, the filtered second FFT data are returned to the original spectrum data of the time domain data by inverse Fourier transform calculation (step 74), but now include the VBW filter response. The display time axis is replaced with a frequency axis by inverse operation of the step 66 process, using the defined corresponding relationship between the frequency and time changes (step 76). The result is spectrum data that is now filtered by the desired VBW. The resultant data may be displayed as a display spectrum on the display 52, for example (step 78). The shape of the characteristics of the video filter is typically Gaussian but other shapes can be selectively provided.

FIG. 5 is a flow chart showing an alternative process block 68 to get the same result as the process block 68B shown in FIG. 4 by another method wherein the data processes other than the respective steps 68 are the same as FIG. 4. In the method, an impulse response is calculated based on the desired filter characteristics (VBW) set by the user (step 82), and a convolution integral between the impulse response and the spectrum data of the time domain data is conducted (step 84). Note that the spectrum data are converted into the frequency domain data to conduct the process of the step 68A of FIG. 4, but the data remain time domain data during the calculation in the step 68B of FIG. 5 though these processes provide equivalent results.

A signal analyzer according to the present invention can emulate a swept spectrum analyzer with a video filter even though it does not have an analog video filter. Therefore the present invention allows replacing a swept spectrum analyzer with an FFT-type signal analyzer, such as an FFT-type Spectrum Analyzer for example a real-time spectrum analyzer, even for the frequency analysis that requires a video bandwidth (VBW) setting in the measurement.

What is claimed is:

1. A data processing method for a signal analyzer that digitizes an input signal into digital data, and using calculation to produce display spectrum data, having a frequency axis, comprising:
   defining a sampling interval based upon a given time corresponding to an equivalent sweep time;
   replacing the frequency axis of the display spectrum data with a time axis based upon the corresponding time to produce time-based spectrum data;
   applying filter characteristics to the time-based data to produced filtered time-based spectrum data, wherein the step of applying filter characteristics further comprises:
      performing an FFT on the time-based spectrum data to produce frequency domain data;
      multiplying the frequency domain data by a frequency response corresponding to the filter characteristics to produce filtered frequency domain data; and
      performing an inverse FFT on the filtered frequency domain data to produce filtered time-based spectrum data;
   replacing the time axis of the filtered time-based spectrum data with the frequency axis to produce filtered display spectrum data; and
   displaying the filtered display spectrum data.

2. The method of claim 1, wherein the given time is defined based upon frequency span, resolution bandwidth and video bandwidth.

3. A data processing method for a signal analyzer that digitizes an input signal into digital data, and using calculation to produce display spectrum data, having a frequency axis, comprising:
   defining a sampling interval based upon a given time corresponding to an equivalent sweep time;
   replacing the frequency axis of the display spectrum data with a time axis based upon the corresponding time to produce time-based spectrum data;
   applying filter characteristics to the time-based data to produced filtered time-based spectrum data, wherein the step of applying filter characteristics further comprises:
      calculating an impulse response based upon the filter characteristics; and
      applying a convolution integral between the impulse response and the time-based spectrum data to produce filtered time-based spectrum data;
   replacing the time axis of the filtered time-based spectrum data with the frequency axis to produce filtered display spectrum data; and
   displaying the filtered display spectrum data.

4. The method of claim 3, wherein the given time is defined based upon frequency span, resolution bandwidth and video bandwidth.

5. A data processing method for a signal analyzer that digitizes an input signal into digital data, and using calculation to produce display spectrum data, having a frequency axis, comprising:
   defining a sampling interval based upon a given time corresponding to an equivalent sweep time;
   replacing the frequency axis of the display spectrum data with a time axis based upon the corresponding time to produce time-based spectrum data;
   applying filter characteristics to the time-based data to produced filtered time-based spectrum data, wherein the desired filter characteristics are applied to the display spectrum data by conducting a convolution integral of the display spectrum data, which has the frequency change replaced with the time change, and an impulse response corresponding to the desired filter characteristics
   replacing the time axis of the filtered time-based spectrum data with the frequency axis to produce filtered display spectrum data; and
   displaying the filtered display spectrum data.

6. The method of claim 5, wherein the given time is defined based upon frequency span, resolution bandwidth and video bandwidth.

* * * * *